United States Patent
Huang et al.

(10) Patent No.: US 9,024,407 B2
(45) Date of Patent: May 5, 2015

(54) MONITORING TESTKEY USED IN SEMICONDUCTOR FABRICATION

(75) Inventors: Chin-Chun Huang, Taichung (TW); Ji-Fu Kung, Taichung (TW); Wei-Po Chiu, Hsinchu (TW); Nick Chao, Hsinchu (TW)

(73) Assignee: United Microelectronics Corporation, Hsinchu (TW)

( * ) Notice: Subject to any disclaimer, the term of this patent is extended or adjusted under 35 U.S.C. 154(b) by 805 days.

(21) Appl. No.: 13/313,115

(22) Filed: Dec. 7, 2011

(65) Prior Publication Data
US 2013/0147510 A1 Jun. 13, 2013

(51) Int. Cl.
*H01L 23/52* (2006.01)
*H01L 21/336* (2006.01)
*H01L 23/58* (2006.01)
*H01L 21/66* (2006.01)

(52) U.S. Cl.
CPC .............. *H01L 23/58* (2013.01); *H01L 22/34* (2013.01); *H01L 2924/0002* (2013.01)

(58) Field of Classification Search
USPC .................. 438/219, 283, 294; 257/401, 503, 257/E31.124–E31.126
See application file for complete search history.

(56) References Cited

U.S. PATENT DOCUMENTS

2006/0062050 A1* 3/2006 Lojek ........................ 365/185.28
2013/0320818 A1* 12/2013 Oga et al. ..................... 310/68 D

OTHER PUBLICATIONS

Kwangok Jeong et al., "Dose Map and Placement Co-Optimization for Timing Yield Enhancement and Leakage Power Reduction", 2008, ACM.

* cited by examiner

*Primary Examiner* — Calvin Lee
(74) *Attorney, Agent, or Firm* — WPAT, PC; Justin King

(57) ABSTRACT

A monitoring testkey for a wafer is provided. The monitoring testkey includes a first metal oxide semiconductor (MOS) transistor having a channel extending in a first direction, a second MOS transistor having a channel extending in a second direction, a common gate pad electrically connected to gate electrodes of the first MOS transistor and the second MOS transistor, a first source pad electrically connected to source electrodes of the first MOS transistor and the second MOS transistor, a first drain pad electrically connected to a drain electrode of the first MOS transistor, and a second drain pad electrically connected to a drain electrode of the second MOS transistor. The monitoring testkey helps to improve the critical dimension uniformity and electrical characteristics uniformity of elements in a wafer.

9 Claims, 12 Drawing Sheets

MONITORING TESTKEY USED IN SEMICONDUCTOR FABRICATION

TECHNICAL FIELD

The present invention relates generally to a monitoring testkey, and more particularly to a monitoring testkey used in semiconductor fabrication.

BACKGROUND

In fabrication of semiconductors, the minimum line width of the circuit element is called critical dimension (CD). The smaller the circuit element is, the less variation of the CD is allowed. Thus, many techniques for improving the critical dimension uniformity (CDU) are developed, and exposure-dose control system, which is named DoseMapper (DOMA) and developed by ASML Company, is a typical one of such techniques.

However, CDU improvement is just one of the factors should be considered during fabrication of semiconductors. There is also a desire to improve uniformity of electrical characteristics of different devices at different positions of a wafer.

SUMMARY

In one embodiment, a monitoring testkey includes a first metal oxide semiconductor (MOS) transistor having a channel extending in a first direction, a second MOS transistor having a channel extending in a second direction, a common gate pad electrically connected to gate electrodes of the first MOS transistor and the second MOS transistor, a first source pad electrically connected to source electrodes of the first MOS transistor and the second MOS transistor, a first drain pad electrically connected to a drain electrode of the first MOS transistor, and a second drain pad electrically connected to a drain electrode of the second MOS transistor.

In another embodiment, a testing method of the above monitoring testkey includes: applying a first on-state voltage to the first MOS transistor from the common gate pad while grounding the first source pad; and applying a first voltage to the first drain pad and measuring a first on-state current.

In still another embodiment, a monitoring testkey includes a MOS transistor, a source pad electrically connected to a source electrode of the MOS transistor, a drain pad electrically connected to a drain electrode and a gate electrode of the MOS transistor; and a monitoring pattern formed below the drain pad. The monitoring pattern includes a plurality of bar shaped structures arranged in parallel.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
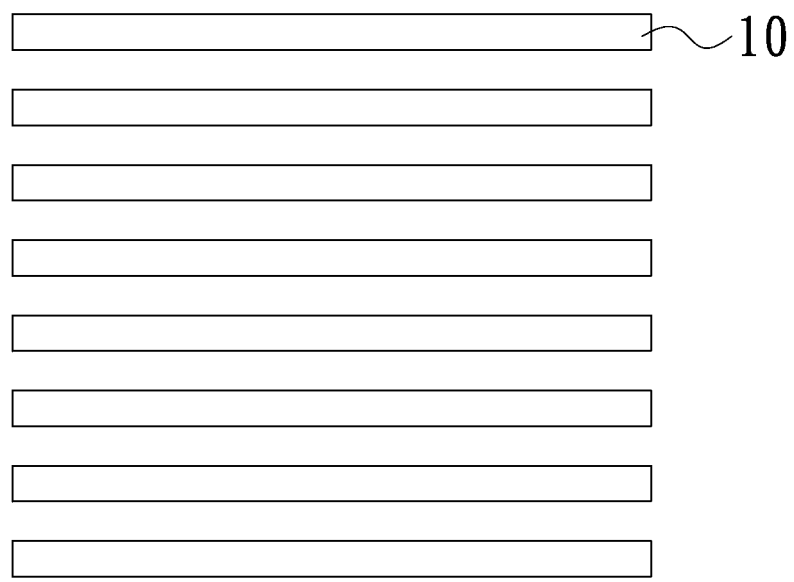
FIG. 1 is a schematic view of a monitoring pattern formed in a wafer.

FIG. 1 illustrates a monitoring pattern, which includes a number of bar shaped patterns 10 arranged in parallel. This monitoring pattern can be formed by a lithography method with a standard exposure. In addition, this monitoring pattern can be distributed at different positions of a wafer. As such, the width of the bar shaped patterns 10 can be measured, and the CD variation at different positions of a wafer is accordingly obtained. The exposure can be controlled and adjusted according to the obtained CD variation. Thus, the CDU is improved.

Figure 2:
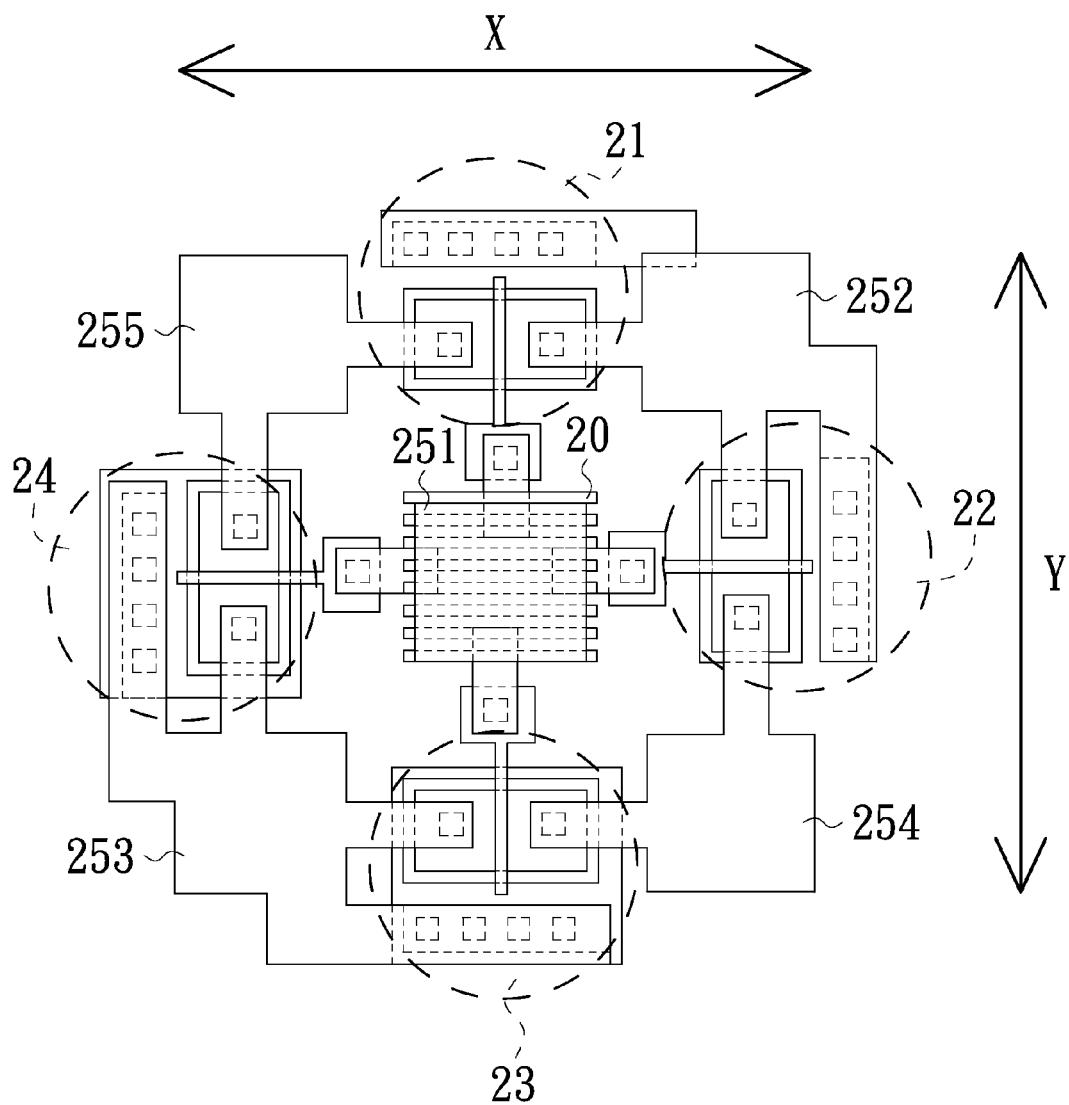
FIG. 2 is a schematic view illustrating a layout of a monitoring testkey in accordance with an embodiment of the present invention.

FIG. 2 illustrates a layout of a monitoring testkey in accordance with an embodiment of the present invention. The monitoring testkey includes four metal oxide semiconductor (MOS) transistors of different conductivity type and extends in different directions. In the present embodiment, the four MOS transistor includes a NMOS 21 having a channel extending along an x-axis direction, a NMOS 22 having a channel extending along a y-axis direction, a PMOS 23 having a channel extending along the x-axis direction, and a PMOS 24 having a channel extending along the y-axis direction. The channel extends along the x-axis direction means that a lengthwise direction of the channel is parallel to the x-axis direction. The x-axis direction, for example, is parallel to lateral scribe lines of a wafer, and the y-axis directions, for example, is parallel to longitudinal scribe lines of the wafer.

Gate electrodes of the four MOS transistors are connected to a common gate pad 251 and a monitoring pattern same to that shown in FIG. 1 is directly below the common gate pad 251. The monitoring pattern includes a number of bar shaped polysilicon 20 arranged in parallel. In addition, the NMOS 21 and 22 share a first source pad 252, the PMOS 23 and 24 share a second source pad 253. The NMOS 22 and the PMOS 23 share a first drain pad 254, and the NMOS 21 and the PMOS 24 share a second drain pad 255. As such, the monitoring testkey has a compact layout and a symmetrical shape. In total, the monitoring testkey includes five pads and a monitoring pattern. Besides, similar to the monitoring pattern of FIG. 1, the monitoring testkey can also be distributed at different positions of a wafer.

As shown in FIG. 2 and related descriptions above, the present embodiment forms four MOS transistors of different conductivity type and extending directions around the bar shaped polysilicon 20. Except the CD variation obtained by measuring the width of the bar shaped polysilicon 20 at different positions of a wafer, the on-sate current variation can also be obtained by measuring the four MOS transistors. Thus, the exposure or other process parameters can be controlled and adjusted according both to the CD variation and the on-state current variation. Accordingly, the CDU and uniformity of electrical characteristics such as on-state current can be improved.

Figure 3A:
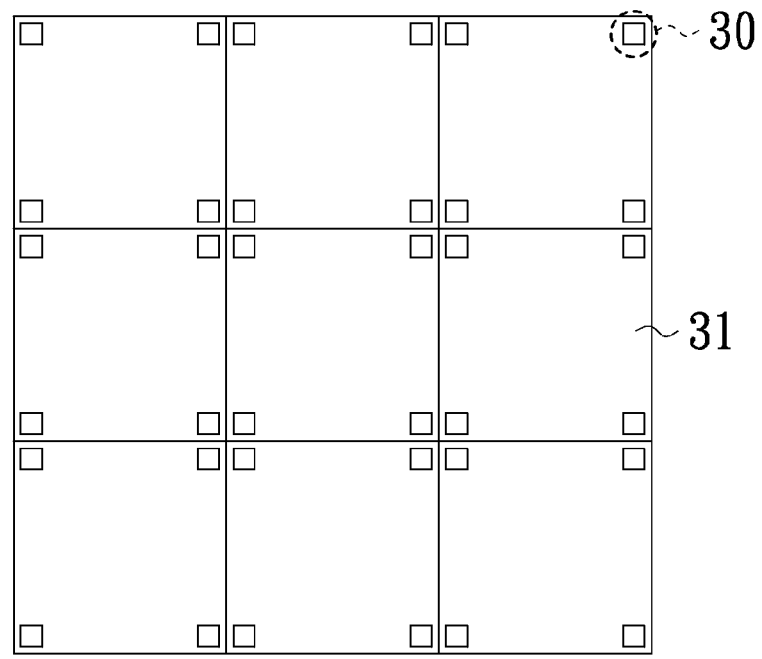
FIGS. 3A through 3C are schematic views illustrating a distribution of the monitoring testkey of FIG. 2 in a wafer.
Figure 3B:
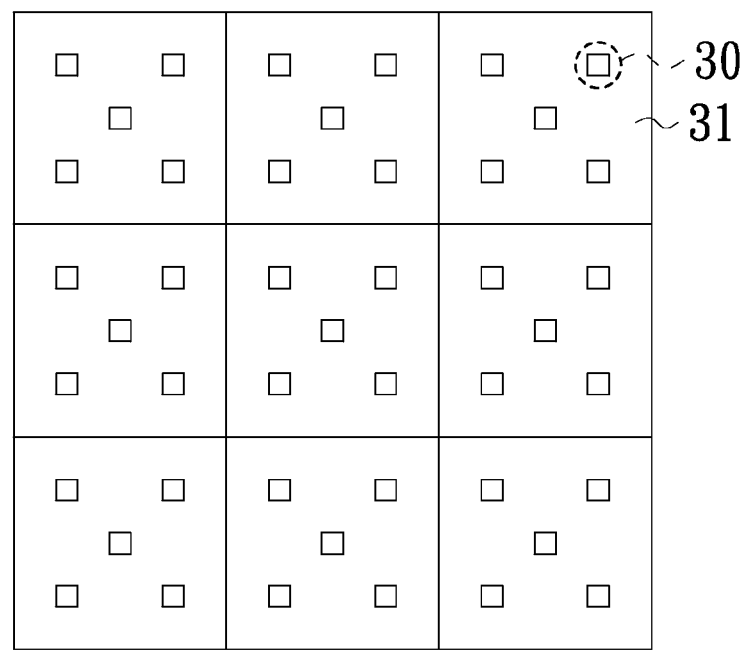
Figure 3C:
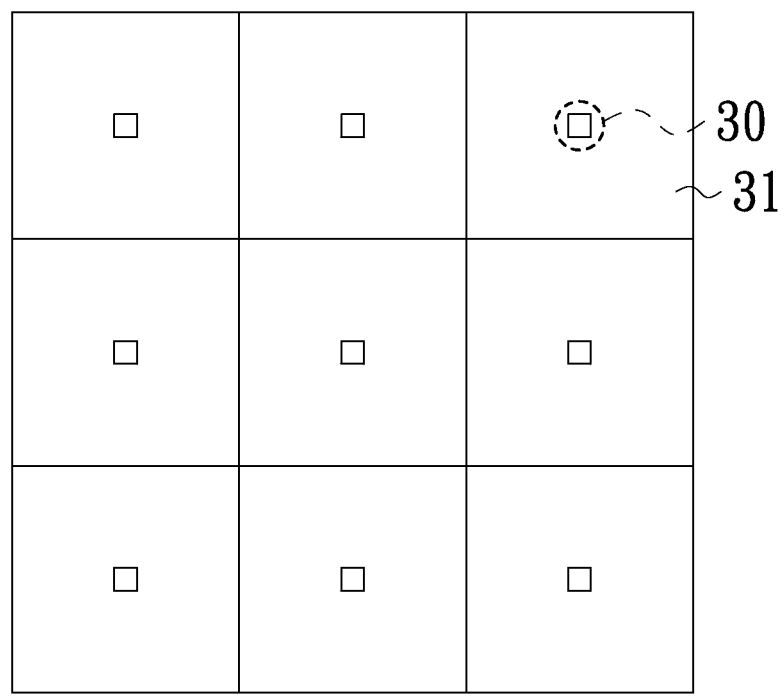

FIGS. 3A, 3B, and 3C are schematic view illustrating the distribution of the monitoring testkey in a wafer. As shown in FIG. 3A, a wafer includes a number of square chips 31 arranged in an array, and a monitoring testkey 30 of FIG. 2 is located at each of the four corners of each of the chips 31. Because the monitoring testkey 30 is located at the corner, this distribution minimizes the influence to the layout of the functional circuits and elements in the chips 31. To maximize the uniformity of electrical characteristics, as shown in FIG. 3B, a number of (e.g., five) monitoring testkeys can be uniformly distributed in each of the chips 31. To balance the influence to the layout of the functional circuits and elements in the chips 31 and the uniformity of electrical characteristics, as shown in FIG. 3C, each of the chips 31 may include one monitoring testkey 30 located at a center thereof.

Figure 4A:
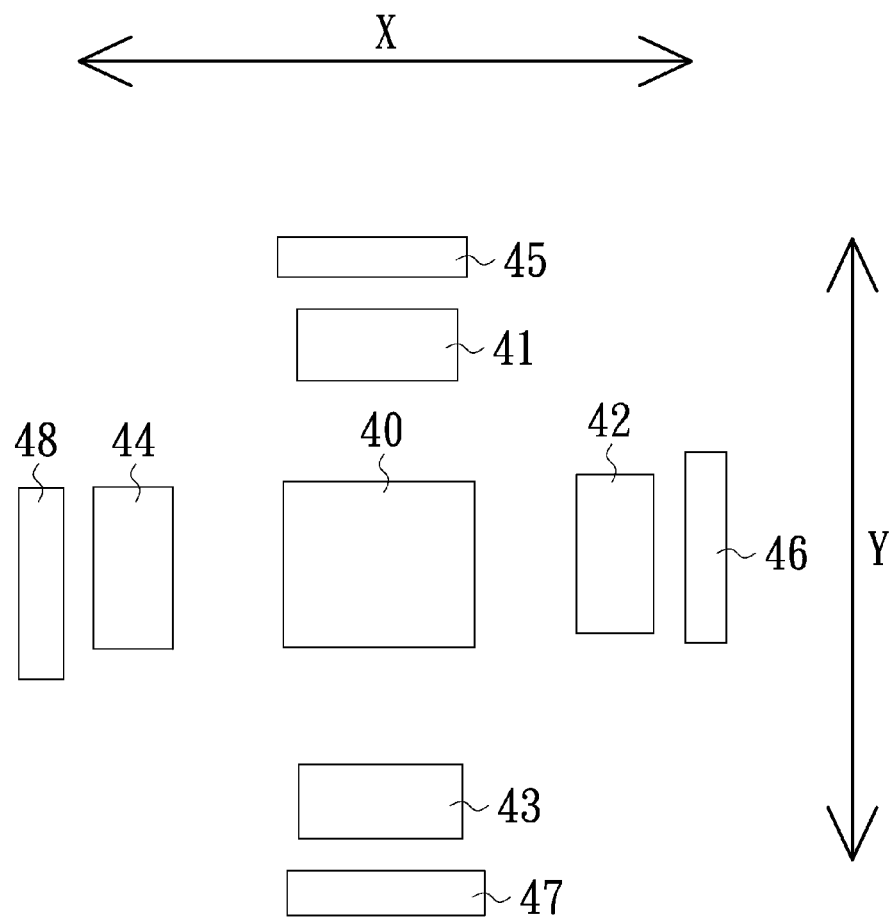
FIGS. 4A through 4G are schematic views illustrating a method for fabricating the monitoring testkey of FIG. 2.

The monitoring testkey can be simultaneously formed with the elements in the chip, which is described as follows with reference to FIGS. 4A through 4G. First, in a process for defining active regions of functional circuits and elements, a pattern as shown in FIG. 4A is also defined, wherein regions 41, 42, 43, 44 define the total regions including source, drain and channel in the four MOS transistors 21, 22, 23, 24, respectively. Regions 45, 46, 47, 48 define the substrate contact regions of the four MOS transistors 21, 22, 23, 24, respectively. A region 40 defines a region for forming the common gate pad and the monitoring pattern shown in FIG. 1. In general, the regions in FIG. 4A, except the regions 40 through 48, are field oxide layers (not shown).

Figure 4B:
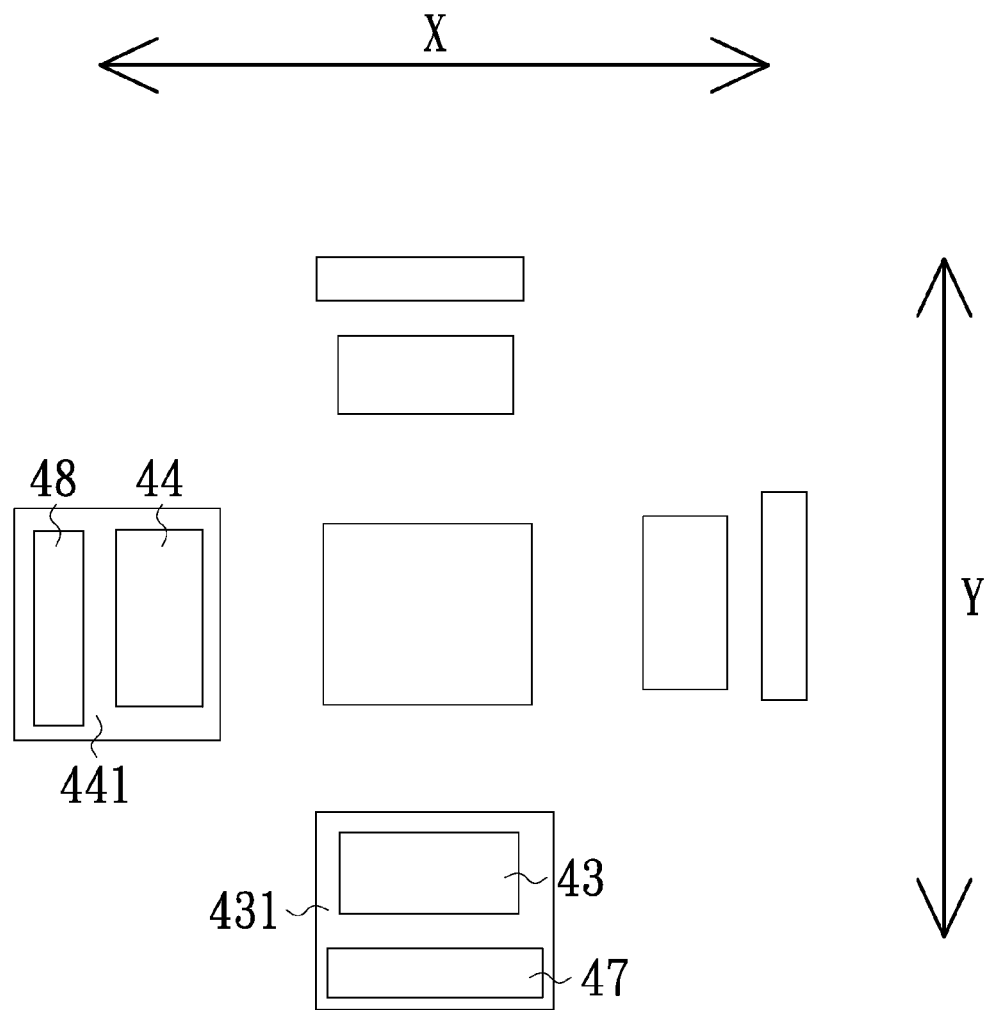
Figure 4C:
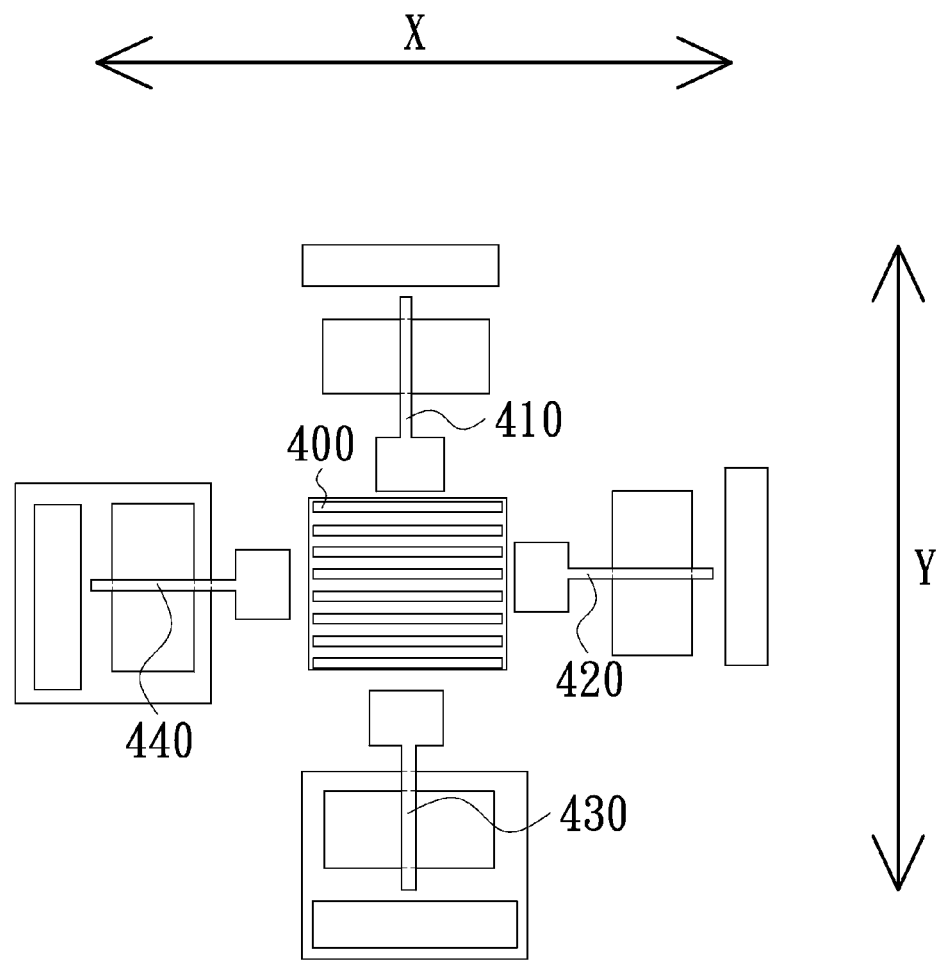

Referring to FIG. 4B, N wells 431 and 441 are formed to surround and enclose regions 43, 44, 47, 48 that are used to form PMOS in the following process. After that, as shown in FIG. 4C, bar shaped polysilicon 400 and gate wires 410, 420, 430, 440 required by the DOMA process are simultaneously formed in a process for defining the gate structure of the functional elements in the chip.

Figure 4D:
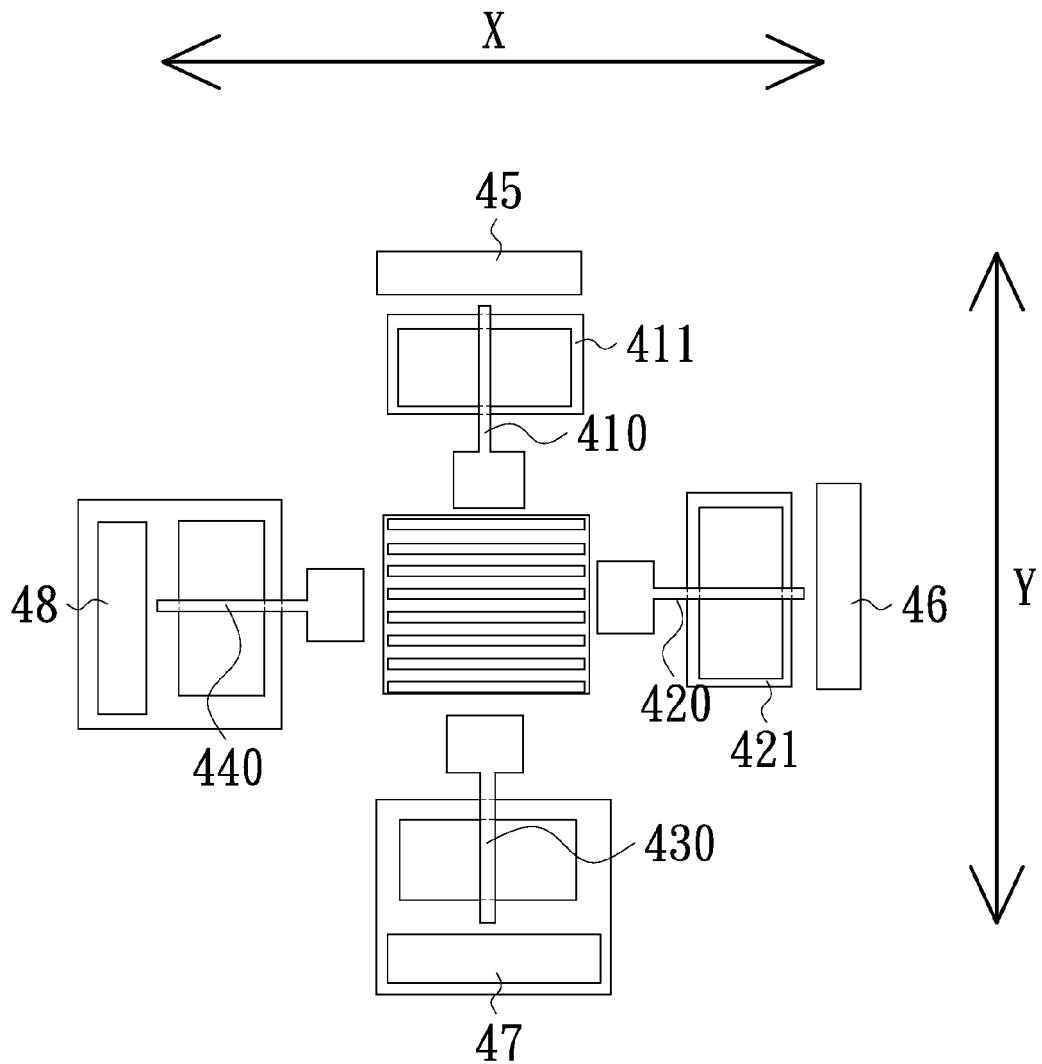
Figure 4E:
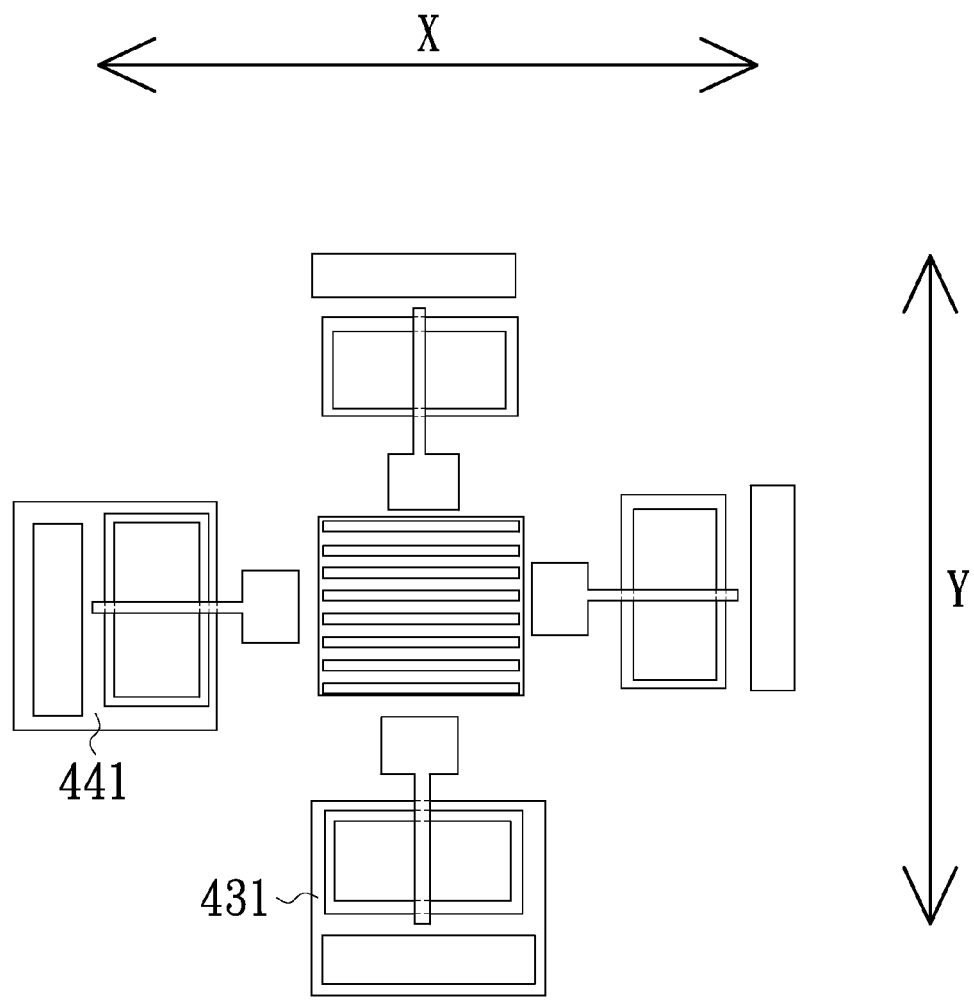

Referring to FIG. 4D, a high concentration N type implantation is performed using the gate wires 410, 420, 430, 440 as a mask to form source/drain regions 411, 421 of NMOS and substrate contact regions 47, 48 of PMOS. The source/drain regions 45 to 48 define substrate contact regions of the four MOS transistors 21, 22, 23, 24, respectively. Similarly, as shown in FIG. 4E, a high concentration P type implantation is performed using the gate wires 410, 420, 430, 440 as a mask to form source/drain regions 411, 421 of PMOS and substrate contact regions 45, 46 of NMOS.

Figure 4F:
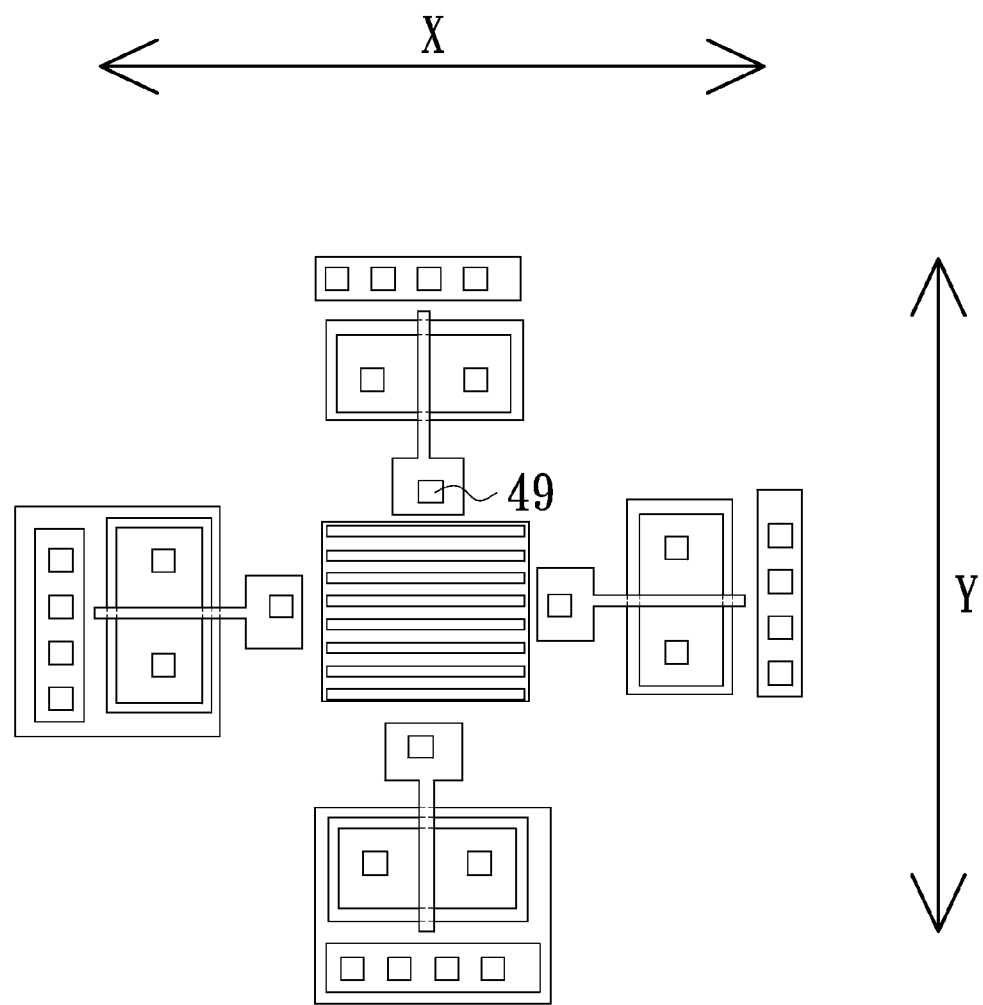

Referring to FIG. 4F, a contact forming process is performed to form a number of contacts 49 on the source/drain regions, the substrate regions and the gate wires. Finally, as shown FIG. 4G, metal wires are formed. After this process, the five pads as shown in FIG. 2 and the metal wires 50 for connecting the five pads to the corresponding source/drain regions are finished. The common gate pad 251 is electrically connected to the gate wires 410, 420, 430, 440 of the four MOS transistors. In addition, source electrode of the NMOS 21, 22 and the substrate share the first source pad 252, the source electrode of the PMOS 23, 24 and the substrate share the second source pad 253. The drain electrode of the NMOS 22 and the drain electrode of the PMOS 23 share the first drain pad 254. The drain electrode of the NMOS 21 and the drain electrode of the PMOS 24 share the second drain pad 255.

As such, the monitoring testkey of the present embodiment and the original DOMA pattern (i.e., the bar-shaped polysilicon 400) coexists and share regions of chips. In the present embodiment, the DOMA pattern is located directly under the gate pad 251 but is not electrically connected to any other circuits or elements. The monitoring testkey of the present embodiment includes MOS transistors of different conductivity type and orientation. These MOS transistors can demonstrate electrical characteristics of MOS transistors of different conductivity type and orientation and the DOMA pattern can show the CDU of circuits. During a wafer acceptance test (WAT), the pads 251, 252, 253, 254 are used to perform the current test. For example, a positive on-state voltage is applied to the NMOS from the common gate pad 251, and the first source pad 252, the first drain pad 254 are grounded. Then, a voltage is applied between the second source pad 253 and the second drain pad 255 to measure the on-state current. Accordingly, on-state current of the NMOS 21, 22 are obtained. Alternately, a negative on-state voltage is applied to the PMOS from the common gate pad 251, and the first source pad 252 and the first drain pad 254 are grounded. Then, a voltage is applied between the second source pad 253 and the second drain pad 255 to measure the on-state current. Accordingly, on-state current of the PMOS 23, 24 are obtained. Repeating the above testing process in each monitoring testkey in the wafer, on-state current variation can be obtained. The exposure or other process parameters can be adjusted according to the on-state current variation to improve the uniformity of on-state current. Besides, other electrical characteristics can also be measured to obtain the variations. Accordingly, the uniformity of other electrical characteristics can also be improved by adjusting the process parameters such as exposure.

Figure 4G:
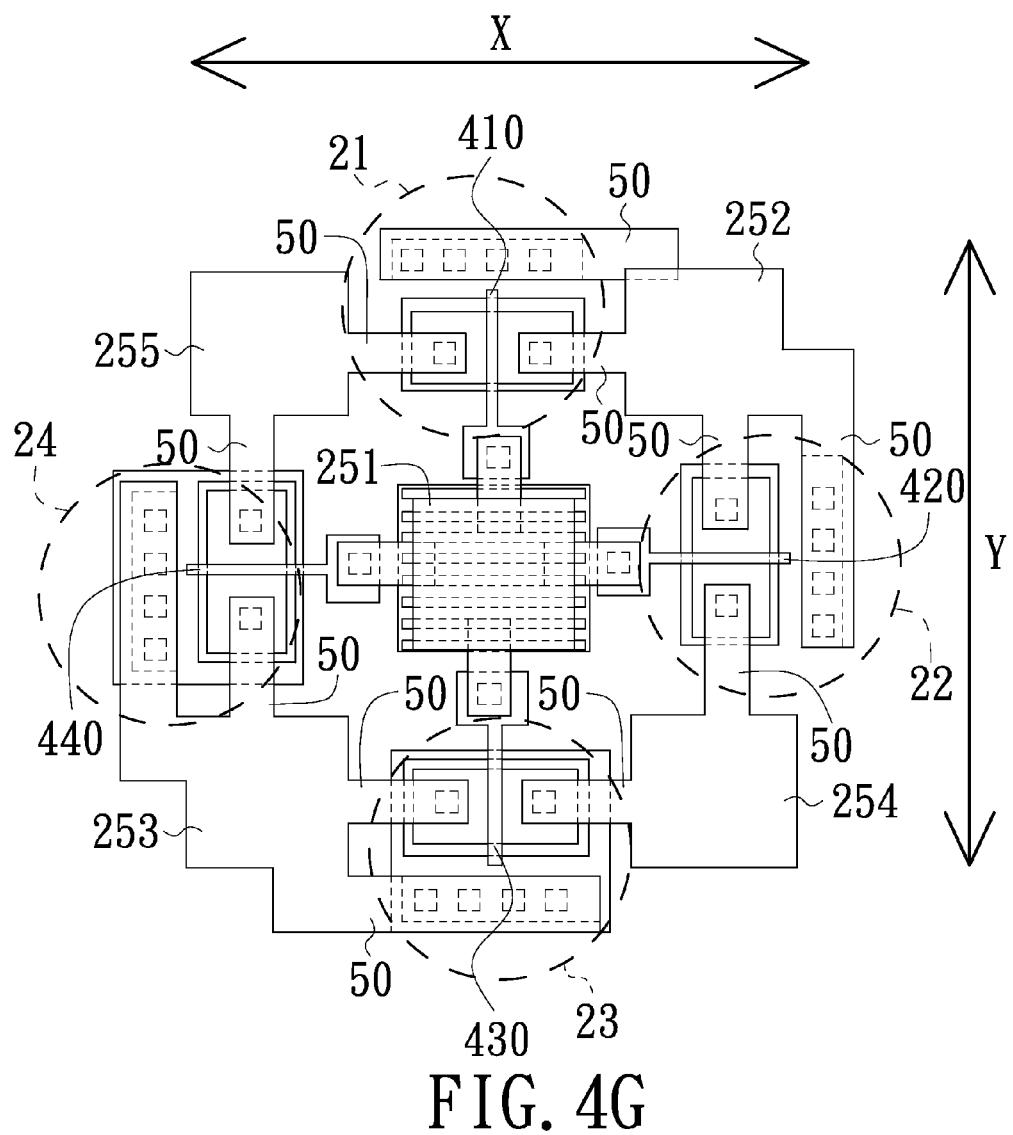
Figure 5:
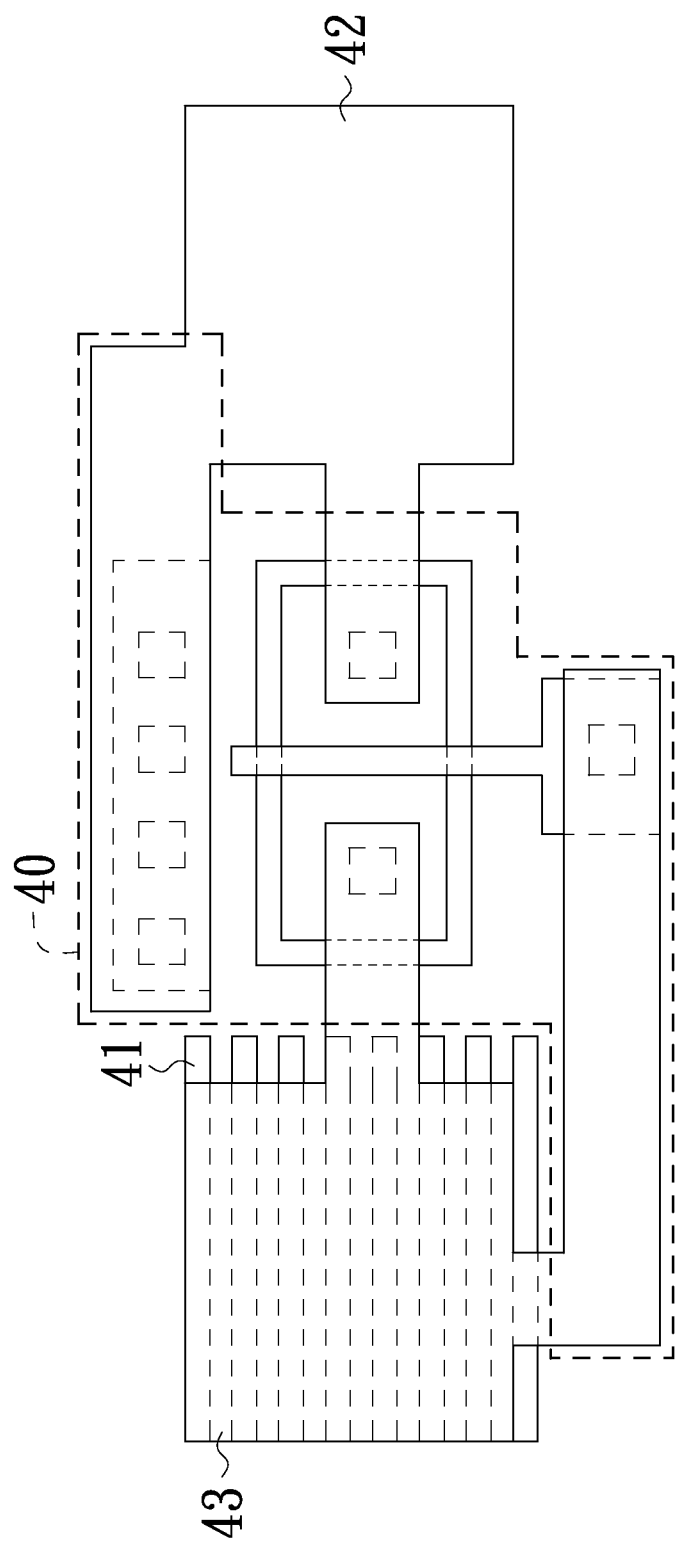
FIG. 5 is a schematic view illustrating a layout of a monitoring testkey in accordance with another embodiment of the present invention.

In another embodiment, the monitoring testkey shown in FIG. 4G is simplified as the one shown in FIG. 5. The monitoring testkey of the present embodiment includes a MOS transistor 40 and a monitoring pattern 41. A source pad 42 that is electrically connected to a source electrode of the MOS transistor 40 is grounded. After an on-state voltage is applied to a drain pad 43 that is electrically connected to a drain electrode and a gate electrode of the MOS transistor 40, the on-state current of the MOS transistor 40 is obtained. The monitoring testkey of the present embodiment has smaller area, and thus can be distributed in scribe lines of a wafer. As such, the monitoring testkey doesn't affect the layout of the functional elements in the chip. The monitoring pattern 41 can be formed directly below the drain pad 43. The monitoring pattern 41 includes a number of bar shaped structures arranged in parallel. The bar shaped structures may be consisting of polysilicon, and are used to obtain the CD variation. The MOS transistor 40 is of a P type or an N type transistor, and a lengthwise direction of a channel thereof is parallel to the x-axis or the y-axis.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A monitoring testkey, formed in a wafer, the monitoring testkey comprising:
   a first metal oxide semiconductor (MOS) transistor, a channel of the first MOS transistor extending in a first direction;
   a second MOS transistor, a channel of the second MOS transistor extending in a second direction;
   a common gate pad, electrically connected to a gate electrode of the first MOS transistor and a gate electrode of the second MOS transistor;
   a first source pad, electrically connected to a source electrode of the first MOS transistor and a source electrode of the second MOS transistor;

a first drain pad, electrically connected to a drain electrode of the first MOS transistor; and a second drain pad, electrically connected to a drain electrode of the second MOS transistor.

2. The monitoring testkey of claim 1, wherein the first direction is parallel to the second direction.

3. The monitoring testkey of claim 1, wherein the first direction is orthogonal to the second direction.

4. The monitoring testkey of claim 3, further comprising:
a third MOS transistor, a channel of the third MOS transistor extending in the first direction, and a drain electrode of the third MOS transistor being electrically connected to the first drain pad;
a fourth MOS transistor, a channel of the fourth MOS transistor extending in the second direction, a drain electrode of the fourth MOS transistor being electrically connected to the second drain pad, a gate electrode of the third MOS transistor and a gate electrode of the fourth MOS transistor being electrically connected to the common gate pad; and
a second source pad, electrically connected to a source electrode of the third MOS transistor and the fourth MOS transistor.

5. The monitoring testkey of claim 4, wherein the first MOS transistor and the second MOS transistor are of a first conductivity type, and the third MOS transistor and the fourth MOS transistor are of a second conductivity type.

6. The monitoring testkey of claim 1, wherein the monitoring testkey is repeatedly formed in a plurality of chips in the wafer.

7. The monitoring testkey of claim 6, wherein the monitoring testkey is repeatedly formed at four corners of each of the chips.

8. The monitoring testkey of claim 6, wherein the monitoring testkey is repeatedly and uniformly distributed in the each of the chips.

9. The monitoring testkey of claim 6, wherein the monitoring testkey is repeatedly formed at a center of each of the chips.

* * * * *